US006778917B1

(12) United States Patent
Jansen

(10) Patent No.: US 6,778,917 B1
(45) Date of Patent: Aug. 17, 2004

(54) METHOD FOR DRIVING AN ELECTRONIC METERING SYSTEM AND A METERING SYSTEM FOR CARRYING OUT THE METHOD

(76) Inventor: Dirk Jansen, An der Koppel 7, D-22844 Norderstedt (DE)

( * ) Notice: Subject to any disclaimer, the term of this patent is extended or adjusted under 35 U.S.C. 154(b) by 0 days.

(21) Appl. No.: 09/431,457

(22) Filed: Nov. 1, 1999

(30) Foreign Application Priority Data

Nov. 4, 1998 (DE) .......................................... 198 50 841

(51) Int. Cl.[7] .............................................. G01R 21/06

(52) U.S. Cl. ............................ 702/45; 702/60; 702/62; 702/65

(58) Field of Search .............................. 702/60, 62, 65, 702/45, 46, 47, 64; 324/76.11, 76.77, 116, 115, 107, 137; 340/870.01, 870.02, 870.31, 10.1; 346/14 MR

(56) References Cited

U.S. PATENT DOCUMENTS 4,908,017 A * 3/1990 Howson et al. ............. 604/154
5,658,250 A * 8/1997 Blomquist et al. ............ 604/31
5,662,612 A * 9/1997 Niehoff ....................... 417/15
5,808,558 A * 9/1998 Meek et al. ........... 340/870.01
6,507,794 B1 * 1/2003 Hubbard et al. .............. 702/60
6,577,961 B1 * 6/2003 Hubbard et al. .............. 702/60

OTHER PUBLICATIONS

Lester–G. "A communication protocol for reading and programming electronic metering devices from hand held units", 5th International Conference on Metering Apparatus and Tariffs for Electricity supply, IEE, London, UK, Apr. 1987, p. 237–41.* http://www.webopedia.com/TERM/R//RS_422_and__RS_423.html.*

* cited by examiner

*Primary Examiner*—Kamini Shah
(74) *Attorney, Agent, or Firm*—Sidley Austin Brown & Wood, LLP

(57) ABSTRACT

A method for operating an electronic metering system with an electronic hand metering device which includes an electrical drive, at least one displacement device such as a piston drivable by the drive, a program-controlled electronic control, at least one non-volatile write-read memory, an electrical voltage source and a data interface connected to the electronic control, with a computer and a data transfer device. The data transfer device includes a data interface for connecting the data interface of the metering device to the computer such that parameters specific to the apparatus type, apparatus, user parameters, routines for carrying out operating procedures, the program and at least one programming part may be written into and read from the write-read memory and read from the hand metering device can be remote controlled.

25 Claims, 6 Drawing Sheets

METHOD FOR DRIVING AN ELECTRONIC METERING SYSTEM AND A METERING SYSTEM FOR CARRYING OUT THE METHOD

BACKGROUND OF THE INVENTION

The invention relates to a method for driving an electronic metering system with an electrical hand metering device and to a metering system for carrying out the method.

Electronic metering devices are applied in the laboratory for metering fluids. They are known in various embodiments. Metering devices functioning according to the air cushion principle have an integrated piston-cylinder unit, by way of which an air column is displaceable in order to suction sample fluid into a metering syringe and to expel this from the syringe. With this the piston-cylinder unit does not come into contact with the fluid. Only the metering syringe which as a rule consists of plastic is contaminated and may be exchanged after use.

With direct displacement metering devices on the other hand a syringe is directly filled with sample fluid. The piston and the cylinder of the syringe are thus contaminated by the fluid so that the syringe before the exchange of the fluid mostly must be replaced by a new syringe or be cleaned. Also this syringe consists as a rule of plastic.

Pistonless metering devices may comprise a metering tip with a balloon-like end section which is expanded for suctioning fluid, and for expulsion is compressed. Such metering tips are also already conceived as an exchange part.

Micro-metering devices may have a micro-membrane pump and/or a free jet metered, wherein at least one of these components is designed with micro-system technology, in particularly with silicon, glass and plastic injection molding technology and/or plastic imprinting technology. The metering is achieved by deformation of a wall of a container which is filled with fluid. The electrical drive for the deformation of the wall may be piezoelectric, thermoelectric, electromagnetic, electrostatic, electromechanical, magnetorestrictive, etc.

Air cushion, direct displacement, pistonless and micro-metering devices may have an unchangeable or changeable metering volume. A changing of the metering volume is achieved by adjustment of the displacement of the displacement means, i.e. of the displacement path of the piston or of the degree of deformation of the balloon-like end section or of the chamber wall.

Dispensers are metering devices which may repetitively dispense an accommodated fluid in small part quantities.

Furthermore there are multi-channel metering devices which have several “channels” by way of which it is simultaneously metered.

All metering devices may be designed as hand apparatus.

All previously mentioned metering devices may be electronic metering devices in the meaning of this application. With this they comprise a drive means with an electrical drive for driving a displacement means. Furthermore they have an electronic control and/or regulating means in particular for the drive, which may be an electrical drive motor, an electric linear drive or a drive mentioned in the context of micro-metering devices. Furthermore they have an electrical voltage source for supplying the control and/or regulating means and a drive, which may be chargeable. Electronic metering devices have the advantage of the high reproducibility of meterings. In particular by way of preset metering speeds (μl/s) more exact results may be achieved than with manually driven apparatus. Furthermore they may have the advantage of the multi-functionality, since they may carry out functions of pipetting, dispensing, titrating, mixing, etc.

The known electronic hand metering devices Response® of the applicant function according to the air cushion principle and are obtainable in the single-channel or multi-channel design. Four models cover the metering range of 0.5 μl to 5 ml. This metering device may function in various operating manners, amongst other things pipetting and dispensing. The dispensing is possible in up to 25 part steps. The user may select between three various metering speeds. The metering device may be applied for charging the accumulator cells in a charging station.

From EP 0 864 364 A2 there is known a similar hand metering device with chargeable batteries and a charging station for their charging. The hand metering device may be operated in various operating modes, which apart from pipetting and dispensing have a free hand operation. Therein the hand metering device is programmed such that it controls the suctioning, the dispensing and time delays for exchanging and treating the metering tip. It carries out these program steps via a predetermined number of cycles.

The previously known electronic hand metering devices have the disadvantage that the specific operating parameters (e.g. step widths of the piston advance, metering speeds, charging condition criteria, display outputs) and the program are fixedly predetermined. The electronic control means specifically comprises a computer which functions according to a fixed stored program in which these parameters are contained. Thus for each model a special software is required and a retrospective change of the parameters is hardly possible. Furthermore it is disadvantageous that the programming of the free hand operation must be effected tediously via the keyboard of the hand metering device and that in the free hand operation the steps which are programmed in must be rigidly worked through and the course of operation may not be influenced.

Metering devices are testing means within the sense of GLP (Good Laboratory Practice) guidelines and comparable QS standards (ISO 9000 ff, EN 45000 ff).

According to the GLP guidelines the error limits published by the manufacturer must be checked at regular time intervals. By way of the applicant there is known a system with which the calibration of metering devices may be carried out quickly, comfortably and inexpensively.

This system is based on a calibration software PICASO® which runs on a PC. Furthermore one requires a measuring construction which comprises weighing vessels, adapters carrying sleeves as well as vapor traps and a semi-microscale. In the software there is laid down all relevant data for the metering devices to be tested. Deviations from these nominal values after transferring the weighing values to the computer are immediately evaluated. A measuring row has up to 15 individual weighings. From these the mean value, incorrectness, impression and standard deviation are evaluated and compared to predetermined nominal values. All measuring and reference data may be protocolled according to GLP-DIN.

With the calibration via the operating keyboard of the electronic hand metering pipette the metering data is inputted and their operation controlled. The weighing values are typed into a PC. This is tedious and may lead to errors.

BRIEF SUMMARY OF THE INVENTION

The object of the invention is to provide a method for operating an electronic metering system with improved operating parameters, operating procedures, program parts or complete programs. Another object of the present invention is to provide a metering system. A method solving the object is specified in claim 1. Formations of this as well as advantageous metering systems for carrying it out is the subject matter of the subsequent claims.

This object is achieved by a method for operating an electronic metering system with an electronic hand metering device. The hand metering device comprises a drive means comprising an electrical drive; at least one displacement means drivable by the drive means, for metering the fluid; a program-controlled electronic control and/or regulating means, in particular for the drive; at least one non-volatile write-read memory; an electrical voltage source in particular for the electrical drive and the electronic control and/or regulating means and a data interface. The data interface is connected to the electronic control and/or regulating means, with a computer and with a data transfer means. The data transfer means comprises a data interface for connecting the data interface of the metering device to the computer, wherein the parameters specific to at least one of the apparatus type, the apparatus, user parameters, routines for carrying out operating procedures, the program, at least one programming part may be written into and read from the write-read memory and the hand metering device can be remotely controlled by the computer via the data interfaces.

According to the invention thus by way of the external computer access may be made to the write-read memory of the hand metering device. This opens the possibility of changing the operating parameters which the program-controlled electronic control and/or regulating means falls back on for carrying out the operating procedures.

These may be parameters specific to the apparatus type, in particular those which are predetermined for carrying out operating procedures. For example these could be parameters determining the movement of the piston of a displacement means (e.g. acceleration characteristics, piston speed, drive force, retaining moment). Furthermore these may be quantity-determining parameters (e.g. basic values and limit values of metering quantities, possible numbers of metering steps, overstroke volume for the expulsion of remaining fluid). Other parameters specific to the apparatus may in particular concern the monitoring of operating conditions, (e.g. evaluation criteria for the charged condition of an accumulator, for the actuation of the end switch or for the duration of the idle pause for the purpose of switching to a "sleep condition"). Parameters specific to the apparatus may in particular be an identification of the apparatus, a recognition code for a respective stored parameter set, etc.

User parameters are data which also manually may be inputted by the user via a keyboard of the hand metering device. To this belong in particular the metering volume, metering speeds etc. Further use parameters concern the calibration of the hand metering device. In a simple case it may be the case of a correction factor for converting the set metering quantities to the actually dispensed metering quantities. This may in particular also be coefficients of a function which contains the deviation of the set metering quantities from the actually dispensed metering quantities given varying quantity settings.

Furthermore the invention opens the possibility by way of the external computer of placing routines for carrying out operating procedures in the write-read memory of the hand metering device so that the program-controlled electronic control and/or regulating means falls back on these. These routines may be set up by the user and serve the control of operating courses made up of several operating procedures, in particular if these are to be repeatedly gone over. For example by way of such a "short program" the accommodation, mixing and dispensing of certain fluid quantities may be controlled or a thinning row with which the dispensed metering volume is to be halved from thinning step to thinning step. With this the use of routines is simplified for the user. There also exists the possibility of recording routines stored in the computer into the hand metering device.

Furthermore by way of the external computer the program of the program-controlled electronic control and/or regulating means or at least a part of this may be written into the write-read memory and/or read out from this. For this the memory is preferably a flash memory of a processor. A processor with a flash memory has implemented a program presupposed by the manufacturer which for a data exchange may initiate the communication. By way of this it is possible to play into each hand metering device a partly or completely different program from the outside via the data interfaces or to completely or partly change the program.

Furthermore by way of the external computer a remote control of the hand metering device is possible. This in particular favors the calibration in that the respective metering data by way of the computer is transmitted to the hand metering device and where appropriate even its operation is completely controlled by way of the computer. Furthermore the computer may protocol the respective metering data. Where appropriate this may be effected together with the respective readings if these are acquired and played into the computer. Furthermore by way of the computer a wire-connected or wireless remote control of the hand metering device may be effected. This in particular favors an automation of the metering procedures, the application of the hand metering device in a higher-order automisation process or a safe metering in contaminated surroundings.

Thus the invention permits the fixing of specific parameters of the metering device only after the apparatus assembly, even if this includes the installation of a building block with fixed programmed-in software. By way of this it becomes possible for various apparatus models to use one and the same software and electronics hardware. The respective parameters may be fixed according to requirements or even changed. In the extension of this concept even a fixing or change, specific to apparatus type and to apparatus, of program parts or of the whole program is possible. By way of the ability to store user parameters by way of an external computer an additional advantageous operating possibility is created. The invention also favors the automisation of the calibration and of the end control in the manufacture. A simple update to new operating parameters is made possible for the service. The OEM customer may in turn carry out a parameterization for special OEM metering parts. The GLP parameter documentation is made simple for the user and a simplified calibration with PC software is made possible. Also the incorporation into automisation processes is simplified for the user and a remote control is made possible.

The data interfaces of the hand metering device and the data transfer means may be connected to one another for a duration or permanently. It may be the case of data interfaces which are only connected to one another when the hand metering device is applied into the data transfer means. The data interfaces may however also be connected to one another independently of whether the hand metering device is applied into the data transfer means.

The data interfaces of the hand metering device and the data transfer means may be connected by radio transmitters and radio receivers communicating with one another. Also the data interfaces may comprise IR transmitters and IR receivers communicating with one another. By way of this a permanent connection of the data interfaces or a wireless remote control is favored. Additionally or instead of this the data interfaces may comprise electrical contacts able to be connected to one another, which may be connectable by way of application of the hand metering device into the data transfer means.

Preferably the electronic control means comprises a microcomputer, in particular a micro-controller. The data transfer means may be connected to a separate computer for example to a PC or to an integrated computer, in particular a microcomputer or micro-controller.

The electronic control and/or regulating means and/or the computer may comprise usual input and output and memory means, including an exchangeable memory medium. On the exchangeable memory medium there may be present a program for the remote control and/or the calibration of the hand metering device. This favors the equipping of the metering system with software according to requirements and its actualization.

The hand metering device may operate independently of the mains electricity. In particular it may be provided with a chargeable voltage source, for example one or more accumulators. For this case it may have an interface connected to the chargeable voltage source and the data transfer means may comprise a charging part for charging the voltage source and a charging interface connected to the charging part, for connecting to the charging interface of the hand metering device. The charging interfaces of the hand metering device and the data transfer means may have cooperating electrical charging contacts. These may coincide with the contacts of the data interfaces. The data transmission may in particular be effected with the charging voltage or the charging current of the charging part By modulation of the charging voltage of the charging current on the same physical channel a data transmission may be realized.

The data transfer means may be designed as a stationary part. In particular in this case the hand metering device may also be used as a stationary apparatus or as a metering automatic machine when it is applied into the data transfer means. Then the voltage supply of the hand metering device may be ensured via the charging part.

Further formations of the invention are specified in the dependent claims.

BRIEF DESCRIPTION OF THE DRAWINGS

The invention is hereinafter described in more detail by way of the accompanying drawings of preferred embodiment examples.

The drawings show.

With the explanation of the various embodiment examples, for corresponding invention elements the same reference numerals are used. In as far as this is concerned the description is valid for all embodiment examples.

DETAILED DESCRIPTION OF THE INVENTION

Figure 1:
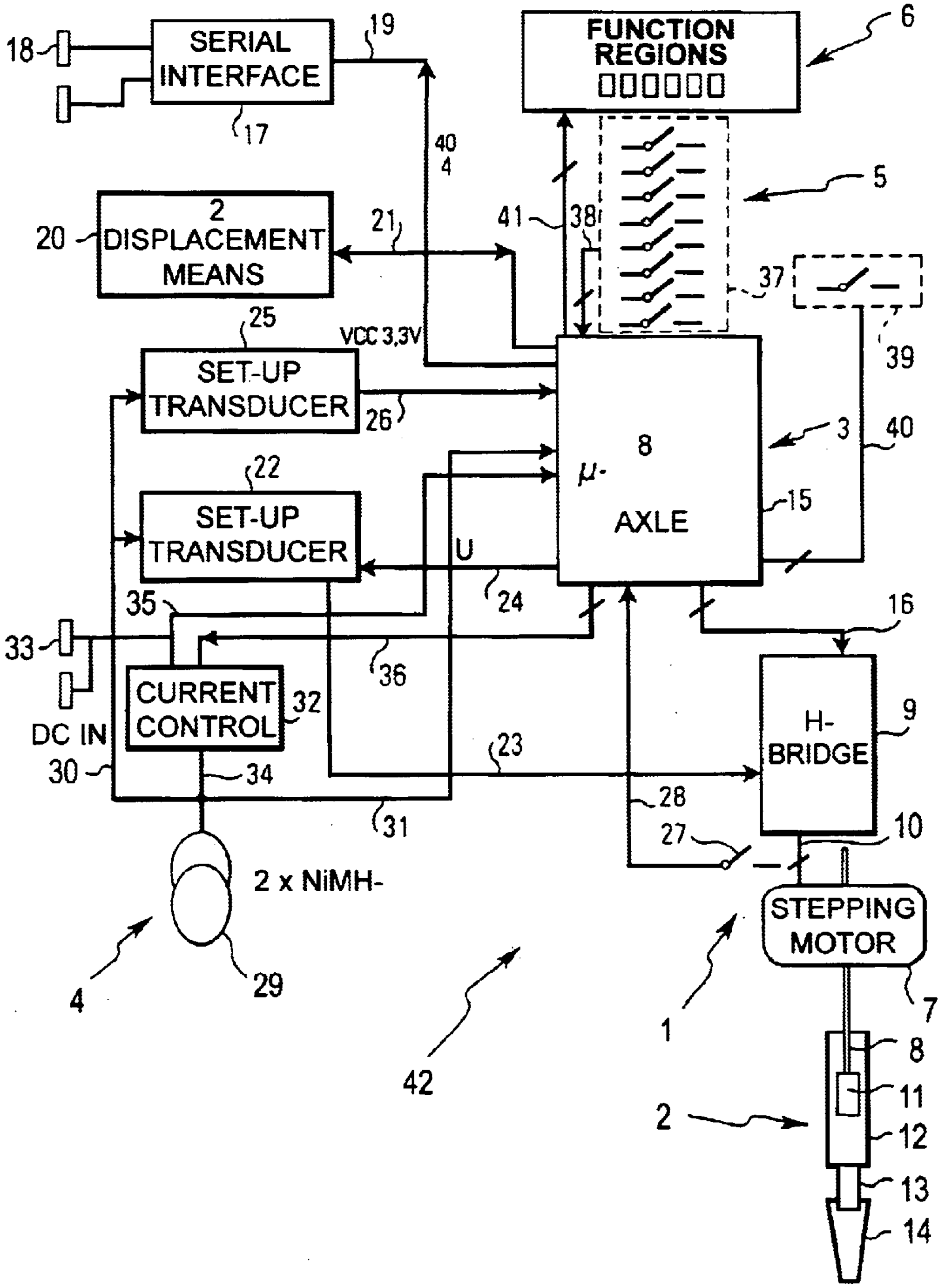
FIG. 1 a hand metering device for metering systems according to FIGS. 2 to 5 in a detailed block diagram.

According to FIG. 1 the electronic pipetting device consists essentially of six function regions, specifically a drive means 1, a displacement means 2, an electronic control and/or regulating means 3, an electrical voltage source 4, and operating means 5 and a display means 6. All function regions 1 to 6 are formed in or on a pipette housing -not shown—of a hand pipette.

The drive means 1 comprises an electrical drive motor which is designed as a stepper motor 7. By way of the stepper motor 7 an axle 8 may be displaced linearly forwards and backwards. Furthermore to the drive means there belongs a motor step in the form of two H-bridges 9 which serve the control of the stepper motor 7. This in the manner known to the man skilled in the art comprises eight power transistors connected in an H-arrangement, with which the stepper motor 7 via supply leads 10 may be operated in the forwards or backwards direction.

The displacement means 2 comprises a piston 11 which is fixed on the axle 8. The piston 11 is displaceable in a cylinder 12. This is connected via a channel 13 to a pipette tip 14 which is separable from the device.

To the electronic control and/or regulating means 3 there belongs a micro-controller 15 which in particular has integrated a timer, an operating memory and a non-volatile memory. The micro-controller controls the H-bridges via control leads 16.

To the electronic control and/or regulating means 3 there belongs a bidirectional serial interface 17 which comprises electrical sliding contacts 18 and via data leads 19 is connected to the micro-controller 15. Moreover to the means there belongs an EEPROM 20 which via data leads 21 is connected to the micro-controller 15.

Furthermore the electronic control and/or regulating means 3 has a step-up transducer 22 for producing the supply voltage of the stepper motor 7 which via supply leads 23 feeds the H-bridges 9. Control leads 24 connect the micro-controller 15 to the step-up transducer 22.

A further component of the control and/or regulating means 3 is a further step-up transducer 25 which supplies the micro-controller 15 via further supply leads 26.

To the axle 8 of the stepper motor 7 there is allocated an end bearing switch 27 which via a control lead 28 is monitored by the micro-controller 1S in order to permit a zero-point setting.

The electrical voltage source 4 comprises two NiMH accumulators 29 whose feed voltage via feed leads 30 are supplied to the step-up transducer 22 and the further step-up transducer 25. The feed voltage of the two accumulators 29 are supplied via control leads 31 to the micro-controller 15. Furthermore to the electrical voltage source 4 there belongs a charging current control 32 which on the one hand via charging contacts 33 designed as sliding contacts 28 can be connected to an external voltage source and on the other hand via charging leads 34 is connected to the accumulators 29. The charging current control 32 is furthermore via control leads 35 for the charging voltage and via charging current leads 36 in each case connected to the micro-controller 15.

The operating means 5 comprises an input keyboard 37 which via leads 38 is connected to the micro-controller 15. Furthermore it comprises the trigger button 39 which via leads 40 is connected to the micro-controller 15.

The display means 6 is an LCD display which via leads 41 is connected to the micro-controller 15 which contains a display control.

The design of the function regions 1 to 6 and the associated function blocks are well known to the man skilled in the art. All function regions 1 to 6 are formed in one or on one—not shown-pipette housing of a hand metering device which subsequently as a whole is indicated at 42. Basically this hand metering device 42 functions as follows:

The control software is stored in the micro-controller 15. Metering data before the metering procedure may be inputted by way of an input keyboard 37. By way of the trigger buttons 39 individual pipetting procedures may be triggered. The display 6 displays inputted data, control commands and operating conditions of the hand metering device 42.

The complete feed voltage of the two accumulator cells 29 is 2.4 Volts. This is regulated by the further step-up transducer 25 to 3.3 Volts supply voltage for the micro-controller 15.

According to the control, via the control leads 24 the step-up transducer 17 connects through the feed voltage of the accumulators 29 as the supply voltage to the supply leads 23 or increases this to 6 or 8 Volts. Since the micro-controller controls the operation of the stepper motor 7 via the control leads 16, it knows the respective voltage requirement of the stepper motor and correspondingly controls the step-up transducer 22.

The feed voltage is controlled by the micro-controller 15 via the control leads 31. If it falls below an allowable voltage from the display 6 corresponding information is outputted. By way of connection of the charging contacts 33 to an external mains supply part in the case needed a charging of the accumulators 29 may be effected. Via the charging current control leads 36 the charging current is controlled according to the charged condition of the accumulators 29 evaluated via the control leads 31.

Hand metering devices 42 of the above mentioned type—partly modified—are applied in the subsequently explained metering systems.

Figure 2:
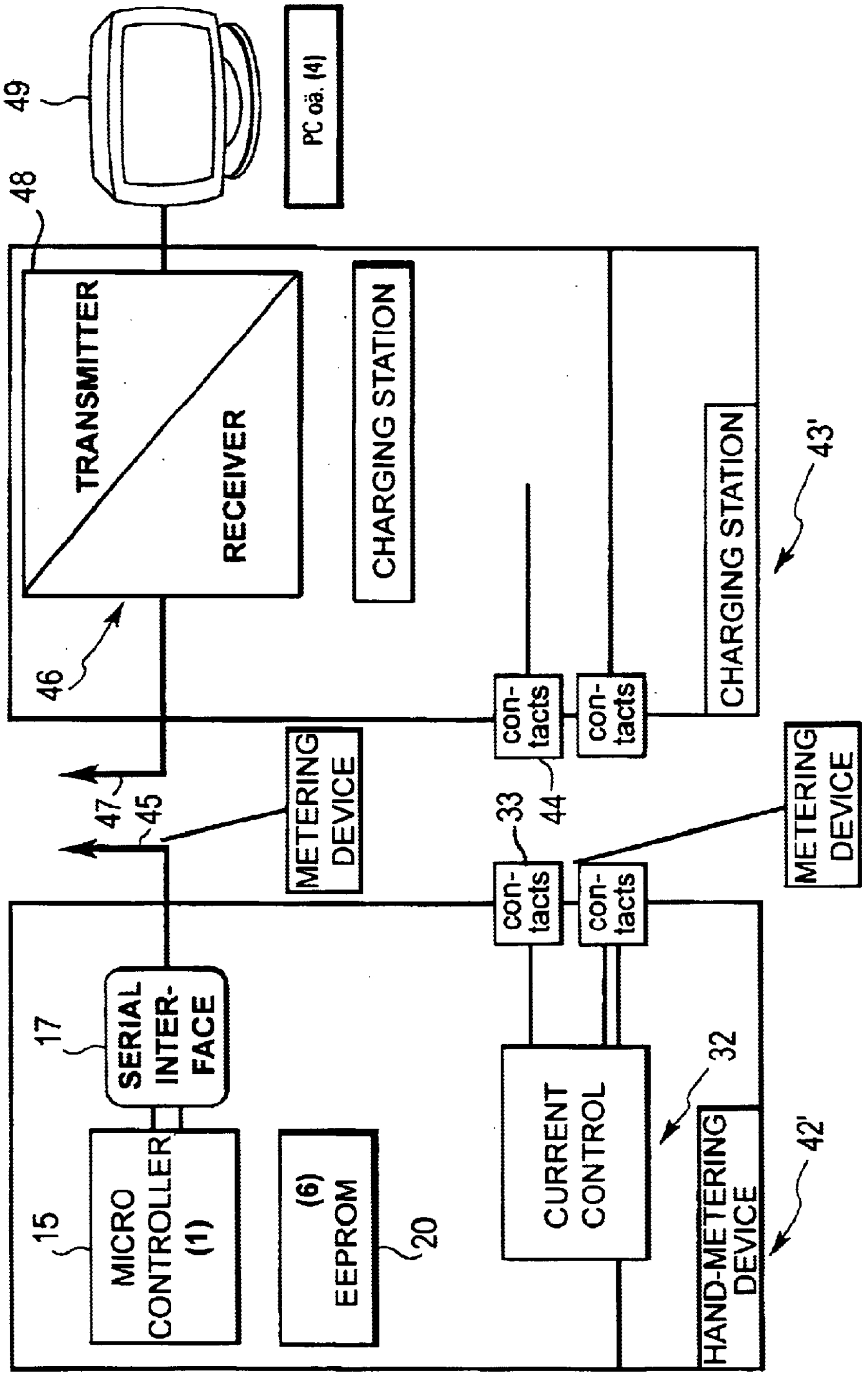
FIG. 2 a metering system with radio data interfaces in a block diagram.

According to FIG. 2 a hand metering device 42' cooperates with a charging station 43'. Allocated to the charging contacts 33 of the hand metering device 42' are suitable charging contacts 44 of the charging station 43.

Deviating from FIG. 1 however the serial interface 17 comprises a HF transmitter and receiver which is coupled to an antenna 45. The charging station 43' comprises a suitable HF transmitter and receiver 46 and an antenna 47 connected thereto for the radio connection to the hand metering device 42'.

The HF transmitter and receiver 46 is connected via a serial interface 48 of the charging station 43 to an external PC 49.

This configuration permits the charging of the accumulators 29 by applying the hand metering device 42' into the charging station 43'. Via the radio connection between the antenna 45, 47, data may be exchanged between the PC 49 and the hand metering device 42', when the hand metering device 42' is applied into the charging station 43' as well as when it is specially separated from this. By way of the PC 49, operating parameters, routines programs or program parts may be written into, or read from the EEPROM 20 of the hand metering device 42. Also by way of the PC 49 a remote control of the hand metering device 42' is possible.

Figure 3:
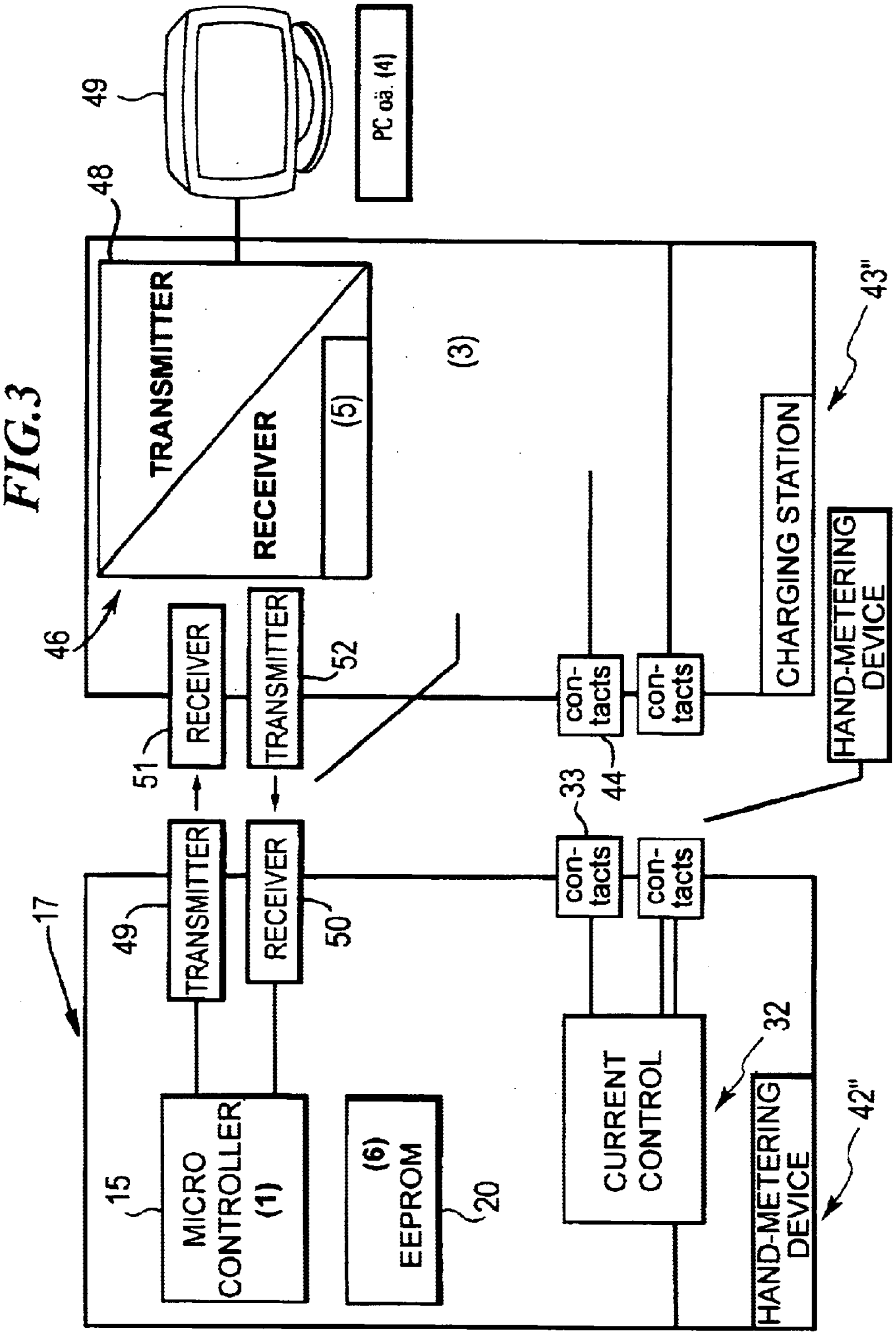
FIG. 3 a metering system with IR data interfaces in a block diagram.

According to FIG. 3 the hand metering device 42" and the charging station 43" in turn comprise charging contacts 43, 44 which can be connected to one another. Deviating from the previous example the data interface 17 however comprises an IR transmitter 49 and an IR receiver 50. In a further deviation the data interface 46 of the charging station 43" comprises a IR receiver 51 and an IR transmitter 52.

Via the IR transmitters 49, 52 and the IR receivers 51, 50 the PC 49 and the hand metering device 42" may again exchange data, basically when the hand metering device 42" is applied into the charging station 43" as well as when it is located outside this.

Figure 4:
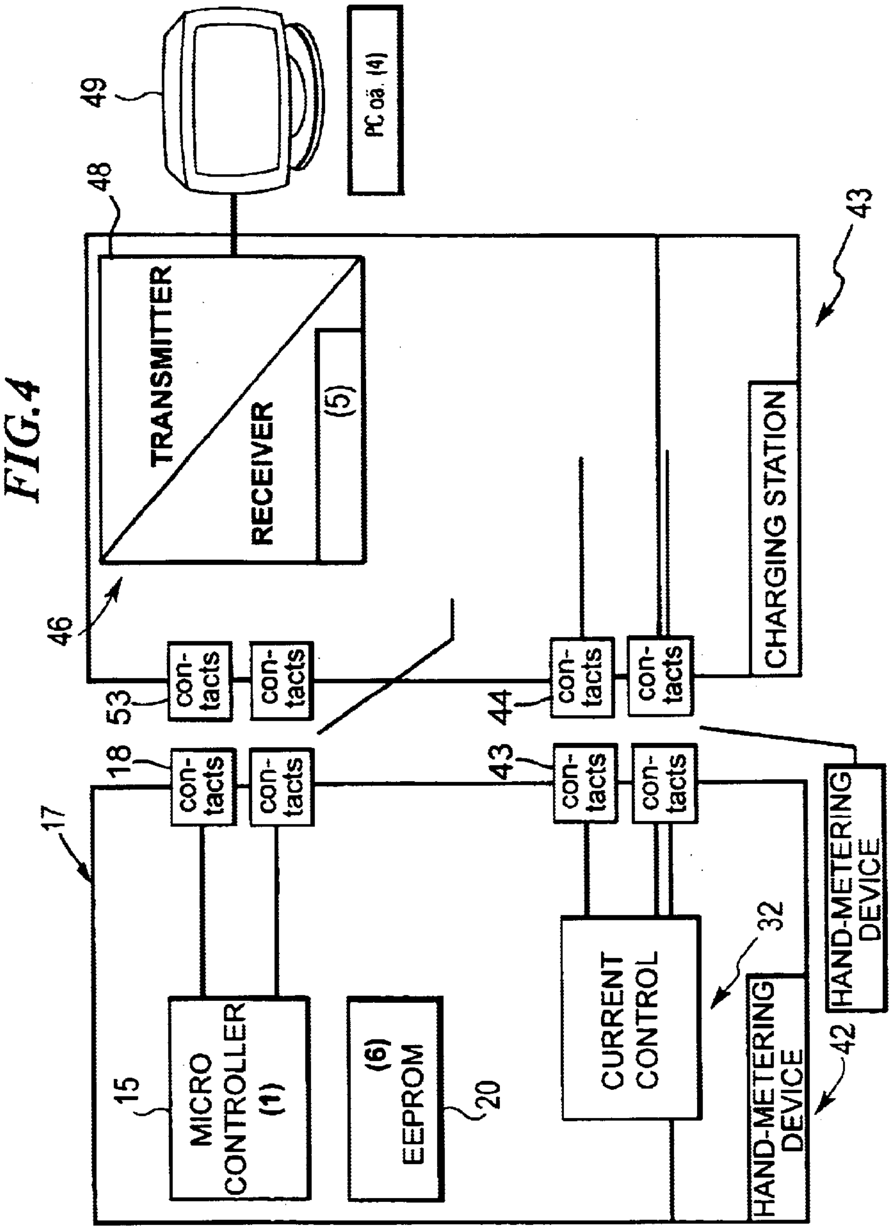
FIG. 4 a metering system with contact data interfaces in a block diagram.

According to FIG. 4 a hand metering device 42 according to FIG. 1 is applied. Allocated to the charging contacts 43 of this are again charging contacts 44 of the charging station 43. To the electrical contacts 18 of the data interface 17 there are allocated the electrical contacts 53 of the data interface 46 of the charging station 43.

With this embodiment the data transmission functions between the PC 49 and the hand metering device 42 when the latter is applied into the charging station 43. This embodiment is relatively simple and particularly operationally safe.

Figure 5:
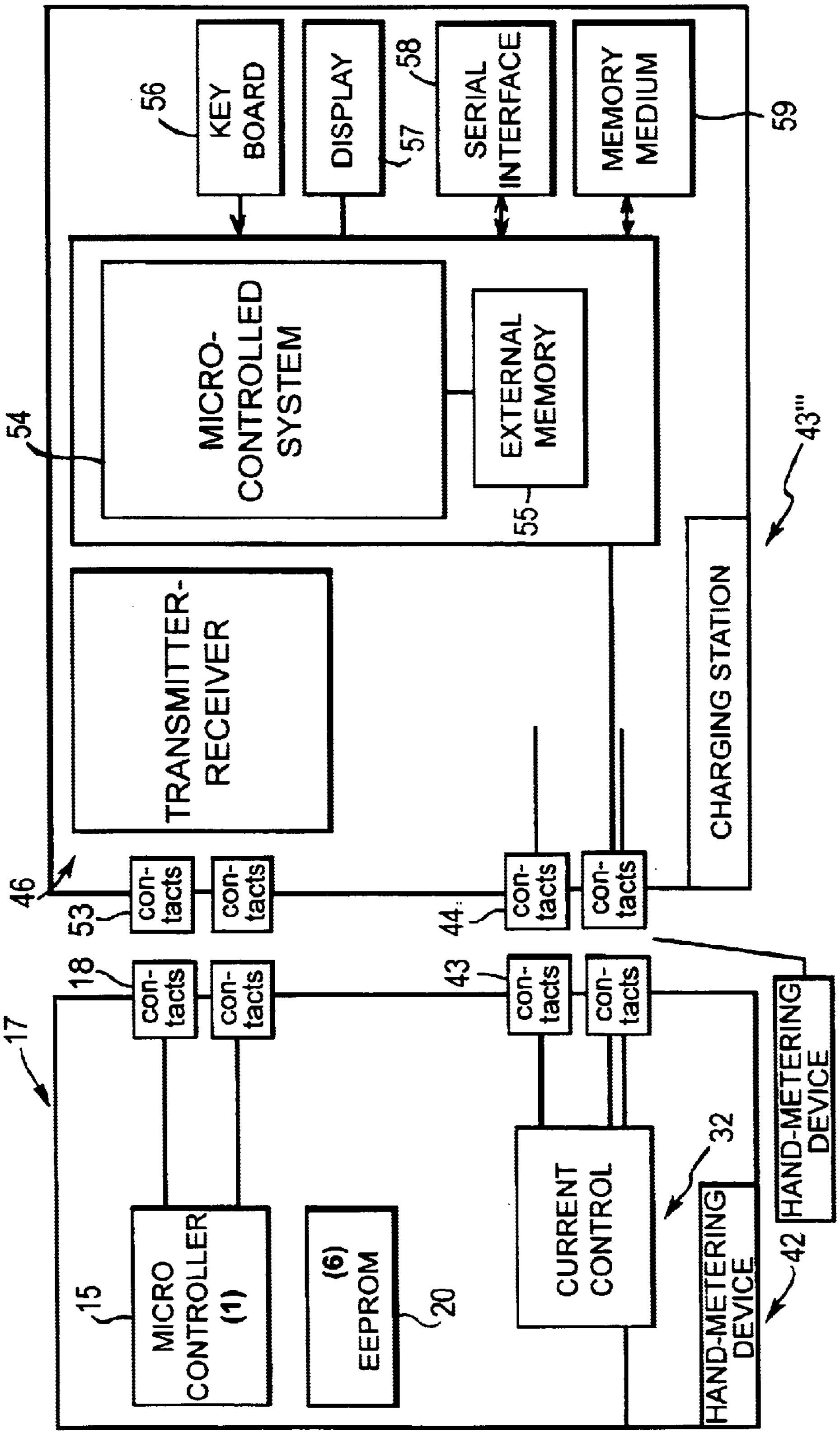
FIG. 5 a metering system with contact data interfaces and computer integrated into the charging station, in a block diagram.

The embodiment according to FIG. 5 differs from that according to FIG. 4 in that the charging station 43''' comprises an integrated micro-controller system 54 with a non-volatile memory 55 as well as a keyboard 56, a display 57, a serial interface 58 and an exchangeable memory medium 59. The exchangeable memory medium 59 may be an EEPROM card, a SMART card, a FLASH card, a disc, etc.

The micro-controller system 54 may assume the functioning of the PC 49. In particular it may serve the control of the data traffic to the hand metering device 42, the triggering of metering functions of the hand metering device 42, the storing of data in internal and external memories 55, 59, 20 of the charging station 43''' and of the hand metering device 42, the data input and the triggering of the hand metering device 42 via the keyboard 56, the display of data on the display and the communication with an external control (PC) via the serial interface 58.

Figure 6:
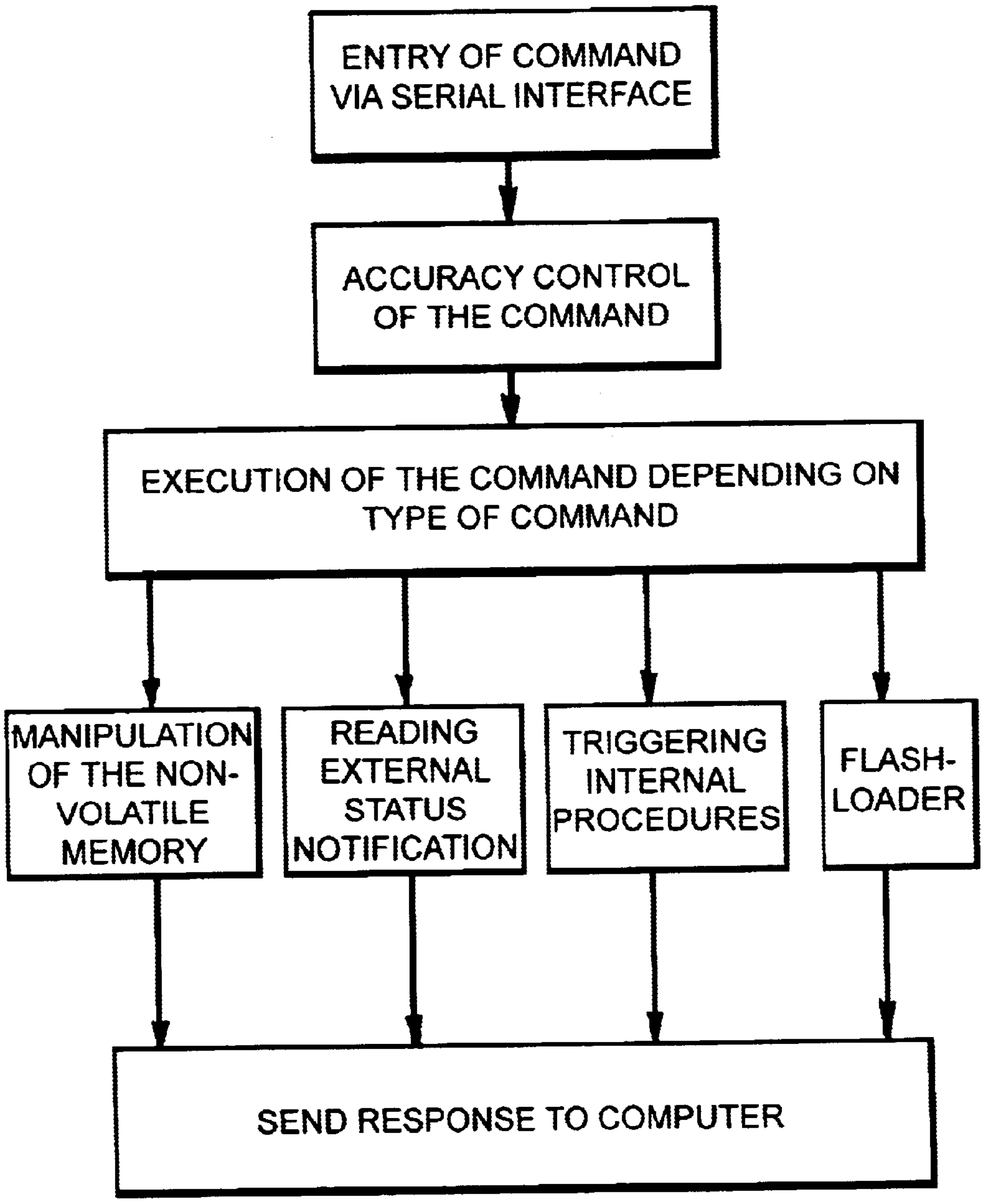
FIG. 6 the communication between the metering system and the computer in a schematic block course diagram.

The serial communication between the metering system and the computer is hereinafter described in more detail by way of FIG. 6.

Between the computer and the metering system there exists an agreement with regard to the implemented command and the transmission framework in the form of a protocol. With this there is fixed a common language by way of which the communication between the metering system and the computer is effected.

The command is entered via the serial interface 58. The accuracy and control of the command is implemented. There is an agreement between the computer and the metering system regarding the implemented command and the transmission framework, in the form of a protocol. As a result, a common language is fixed, by which the communication between the metering system and the computer is effected. Execution of the command depends on the type of command to be implemented.

Various command types are possible. For example, one type of command is the manipulation of the non-volatile memory (e.g. EEPROM 20). Such manipulation includes writing a value to any address of the non-volatile memory and reading the contents of any address of the non-volatile memory. As a result, parameters specific to the apparatus type, to the apparatus and to the user are exchanged.

Another command type is reading external status notifications of the metering system. For example, whether the end switch (e.g. end bearing switch 27) is actuated, which error is notified or whether the motor is active.

Yet another command type is the triggering of internal procedures in the metering system. For example, deleting all error notifications, triggering memory initializations, checking routines for the manufacture, triggering motor actions and thus remote triggering of metering functions, simulation of key pressings, and definition of individual courses.

Yet a further command type is a flashloader, which comprises the steps of reading and programming a new program (or a part thereof) into a non-volatile program memory (e.g. FLASHPROM).

What is claimed is:

1. A method for operating an electronic metering system with an electronic hand metering device comprising, a drive means comprising an electrical drive, at least one displacement means drivable by the drive means for metering the fluid, at least one of a program-controlled electronic control and regulating means for the drive, at least one non-volatile write-read memory, a chargeable electrical voltage source for the electrical drive and the at least one of the electronic control and regulating means enabling the electronic hand metering device to operate independently of the mains electricity and, a data interface connected to at least one of the electronic control and regulating means with an external computer, and with a data transfer means comprising a data interface for connecting the data interface of the metering device to the external computer;

wherein by the external computer via the data interfaces at least one of the method comprising the steps of:

one of writing into and reading from the write-read memory at least one of parameters specific to at least one of the apparatus type and the apparatus, user parameters, routines for carrying out operating procedures, the program, and at least one programming part by way of the external computer via the data interfaces, wherein at least one of the program controlled electronic control and regulating means falls back on at least one of the parameters, routines, programs, and at least one programming part written into the write-read memory for carrying out the operating procedures.

2. The method of claim 1, further comprising the step of using a contact to connect the data interface of the metering device to the data interface of the data transfer means such that the interfaces communicate.

3. The method of claim 2, further comprising the step of using a wireless connection between the data interface of the metering device to the data interface of the data transfer means such that the interfaces communicate.

4. The method of claim 3, further comprising the step of using at least one of a radio, optical connection, inductive connection and capacitative connection between the data interface of the metering device to the data interface of the data transfer means such that the interfaces communicate.

5. An electronic metering system with an electronic metering device with an electronic hand metering device comprising: a drive means comprising an electrical drive; at least one displacement means drivable by the drive means for metering fluid; at least one of a program-controlled electronic control and regulating means for the drive; at least one non-volatile write-read memory; a chargeable electrical voltage source for the electrical drive and at least one of the electronic control and regulating means enabling the electronic hand metering device to operate independently of the mains electricity and, a data interface connected to at least one of the electronic control and regulating means with an external computer and with a data transfer means; wherein the data transfer means comprises a data interface for connecting the data interface of the metering device to the external computer;

wherein by way of the external computer via the data interfaces at least one of parameters specific to at least one of the apparatus type and the apparatus, user parameters, routines for carrying out operating procedures, the program, and at least one programming part are one of written into and read from the write-read memory, wherein at least one of the program controlled electronic control and regulating means falls back on at least one of the parameters, routines, programs, and at least one programming part written into the write-read memory for carrying out the operating procedures.

6. The metering system of claim 5, wherein the data interfaces of the metering device and the data transfer means each have at least one of radio transmitters and receivers communicating with one another and IR transmitters and receivers communicating with one another.

7. The metering system of claim 5, wherein the data interfaces of the metering device and the data transfer means are serial data interfaces.

8. The metering system of claim 5, wherein the at least one of the program controlled electronic control and regulating means comprises one of a microcomputer and a micro-controller.

9. The metering system of claim 5, wherein the non-volatile read-write memory is a flash memory of one of the microcomputer and the micro-controller.

10. The metering system of claim 5, wherein the external computer connected to the data interface of the data transfer means comprises a PC connected to the data transfer means.

11. The metering system of claim 5, wherein the data interface of the data transfer means is connected to a an external computer integrated into the data transfer means.

12. The metering system of claim 11, wherein the external computer comprises one of a microcomputer and a micro-controller.

13. The metering system of claim 5, wherein at least one of the at least one of the program controlled electronic control and regulating means and the external computer comprises at least one of a non-volatile memory, a keyboard, a display, a serial interface and an exchangeable memory medium.

14. The metering system of claim 5, wherein the hand metering system has a charging interface connected to a chargeable voltage source and the data transfer means has a charging part for charging the voltage source and a charging interface connected to the charging part for connecting to the charging interface of the hand metering device.

15. The metering system of claim 5, wherein the metering device and the data transfer means each have common charging and data interfaces.

16. The metering system of claim 14, wherein the at least one of the program controlled electronic control and regulating means cooperates with the charging current control of the metering device for controlling the charging current corresponding to the charging condition of the voltage source.

17. The metering system of claim 16, wherein the at least one of the program controlled electronic control and regulating means evaluates the charged condition by monitoring the electrical feed voltage of the voltage source.

18. The metering system of claim 14, wherein the data transfer means comprises several charging interfaces for the simultaneous charging of the voltage sources of one of several metering devices and several data interfaces for the simultaneous communication with the data interfaces of several metering devices.

19. The metering system of claim 14, wherein the data transfer means comprises at least one charging interface for a chargeable electrical voltage source that can be removed from the metering device.

20. The metering system of claim 14, wherein the charging interfaces of the metering device and of the data transfer means and of the removable voltage source comprise electrical charging contacts connectable to one another.

21. The metering system of claim 5, wherein the hand metering device is independent of the mains supply.

22. The metering system of claim 5, wherein the data transfer means is a stationary apparatus.

23. The method of claim 1, further comprising the step of remotely controlling the hand metering device by the external computer.

24. The metering system of claim 5, wherein the hand metering device is remotely controlled by the external computer.

25. The metering system of claim 5, wherein the data interfaces of the metering device and the data transfer means have electrical contacts that are electrically connectable to one another.

* * * * *

UNITED STATES PATENT AND TRADEMARK OFFICE

CERTIFICATE OF CORRECTION

PATENT NO. : 6,778,917 B1
DATED : August 17, 2004
INVENTOR(S) : Dirk Jansen

It is certified that error appears in the above-identified patent and that said Letters Patent is hereby corrected as shown below:

Title page,
Insert Item -- [73] Assignee: Eppendorf AG, Hamburg (DE) --.

Signed and Sealed this

Second Day of May, 2006

JON W. DUDAS
*Director of the United States Patent and Trademark Office*